United States Patent
Arnold et al.

(10) Patent No.: US 6,553,661 B2
(45) Date of Patent: Apr. 29, 2003

(54) SEMICONDUCTOR TEST STRUCTURE HAVING A LASER DEFINED CURRENT CARRYING STRUCTURE

(75) Inventors: Richard W. Arnold, McKinney, TX (US); Lester Wilson, Sherman, TX (US); James Forster, Barrington, RI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/754,834

(22) Filed: Jan. 4, 2001

(65) Prior Publication Data

US 2002/0084799 A1 Jul. 4, 2002

(51) Int. Cl.⁷ .................... H05K 3/02; G01R 31/02
(52) U.S. Cl. .................. 29/847; 29/842; 29/844; 29/853; 324/754
(58) Field of Search .................. 29/829, 842, 844, 29/847, 850, 853; 216/65; 219/121.68; 324/158, 158.1, 754, 755, 761

(56) References Cited

U.S. PATENT DOCUMENTS

| | | | | |
|---|---|---|---|---|
| 4,404,059 A | * | 9/1983 | Livshits et al. | 156/151 |
| 4,906,920 A | * | 3/1990 | Huff et al. | 324/73.1 |
| 5,180,977 A | * | 1/1993 | Huff et al. | 324/158 |
| 5,264,787 A | * | 11/1993 | Woith et al. | 324/72.5 |
| 5,422,574 A | * | 6/1995 | Kister | 324/754 |
| 5,583,445 A | * | 12/1996 | Mullen | 324/753 |
| 5,643,472 A | * | 7/1997 | Engelsberg et al. | 134/1 |
| 5,929,521 A | * | 7/1999 | Wark et al. | 257/692 |
| 6,027,346 A | * | 2/2000 | Sinsheimer et al. | 439/66 |
| 6,032,356 A | * | 3/2000 | Eldridge et al. | 29/842 |
| 6,060,891 A | * | 5/2000 | Hembree et al. | 324/754 |
| 6,307,387 B1 | * | 10/2001 | Gleason et al. | 324/754 |
| 2002/0008529 A1 | * | 1/2002 | Wilson et al. | 324/754 |

* cited by examiner

Primary Examiner—Carl J. Arbes
Assistant Examiner—Tim Phan
(74) Attorney, Agent, or Firm—Michael K. Skrehot; Wade James Brady, III; Frederick J. Telecky, Jr.

(57) ABSTRACT

A test structure that is readily and inexpensively configurable to interface with dies having different bond pad configurations is achieved by providing a blank test membrane having a conductive coating or a matrix of conductive lines formed thereon. Once a die bond pad configuration is known, the test membrane can be configured for the die bond pads by using a laser under software control to define connection pads correlating to the die bond pads and also to define interconnecting conductive traces from the connecting pads to contact pads that can be connected to test equipment. In one embodiment, the laser operates to ablate a continuous conductive coating, so as to form conductive pads and traces. In another embodiment, the laser is used to cut various lines in a matrix of conductive lines, so as to define conductive paths from the bond pads to the contact pads for connection to the test equipment.

20 Claims, 3 Drawing Sheets

SEMICONDUCTOR TEST STRUCTURE HAVING A LASER DEFINED CURRENT CARRYING STRUCTURE

TECHNICAL FIELD OF THE INVENTION

This invention relates generally to semiconductor test structures and more particularly to a semiconductor die test carrier that is built with the process of having a laser define the current carrying structures for the interconnection of the IC to the tester.

BACKGROUND OF THE INVENTION

The testing of semiconductor devices is an important part of the design and manufacture of integrated circuits. Many tests, including die and wafer level tests and burn-in tests, are performed during the design and manufacture of semiconductor devices. However, the costs associated with testing these devices are often expensive. In order to control costs of production and costs to the ultimate customer, the costs associated with the design, manufacture and processing of die level and wafer level test and burn-in equipment should be equivalent to or less than the cost per unit to package the integrated circuit die product. Presently, tooling provided for die and wafer level test and burn-in can be two to three times the cost per unit that is represented by packaging. The cost is driven by the expense associated with the micro tooling required to build the interfacing structures to the semiconductor die product. The present tooling process for die and wafer level burn-in structures involves the use of photomasks and plotolithographic processes. These processes are expensive and the tooling can be used for only one version of a semiconductor die product. Typically in the early life of a semiconductor die product there are several revisions that the die product undergoes, e.g. revisions to shrink the overall die size or revisions to accommodate a new package form factor. This means that if a die or wafer tool is built that mirrors the die product at an earlier revision it will become obsolete as soon as the product changes to a newer more advanced revision. The cost associated with reconstructing the die and wafer carrier is just as large as the initial cost bore to interface with the lower die revision. The location of the die bond pads for interconnection to the die carrier changes when such a revision in the silicon takes place. The cost of upgrading the new tooling becomes burdensome to the IC supplier and as a result the suppliers find it more effective to build the entire design and process flows around the packaged product. This limits the form factor that is available to packed parts and thus in the long term limits the packaging options for the IC products. Thus, what is needed is a reliable and low cost tool bare die and wafer level tests and burn-in.

SUMMARY OF THE INVENTION

The present invention discloses a method using a machine-controlled laser to form a test structure that interfaces a semiconductor die to test equipment. The method comprises forming a conductive material layer on a substrate and defining first coordinates on the substrate corresponding to at least one predefined bond pad coordinate on the semiconductor die. The method further comprises defining second coordinates on the substrate corresponding to at least one predefined test equipment contact point location, defining third coordinates on the substrate corresponding to an interconnect between the predefined bond pad and the predefined test equipment contact point location, and ablating portions of the conductive material layer using a laser beam, while leaving unablated portions of the conductive material at the first, second and third coordinates.

One advantage of the present invention is that it eliminates costly customized test carrier structures and provides a low cost alternative that can be easily built. Changing the layout for the features on the test carrier is performed by software control of the laser beam when a new test carrier is to be built.

Because of the ease of changing the electrical conductive traces a new substrate can be built to replace the old and obsolete one that no longer interfaces with the die properly. The time to make the changes for the substrate is as long as it takes to modify the software program that houses the interface coordinates for the die to the test carrier. The cycle time has been reduced from weeks for a photolithography mask to hours for laser driven by software control. The laser can etch lines for substrates that can be easily backfilled into the existing test and burn-in infrastructure. This further helps to reduce the cost of the change over of test substrates.

Another advantage of the present invention is that it can be used throughout the design process for testing the various revisions of a packaged product design. As soon as the design engineer has silicon he is enabled to evaluate the IC that has been built as a single die unit.

A further advantage of the present invention is that S/C suppliers are not constrained to building the entire design and process flows around the packaged product.

BRIEF DESCRIPTIONS OF THE DRAWINGS

FIG. 3b illustrates a preferred embodiment test membrane in use with a form package and FIGS. 4, 5a and 5b illustrate alternative embodiment test membranes.

DETAILED DESCRIPTION OF THE PRESENT INVENTION

Figure 1:
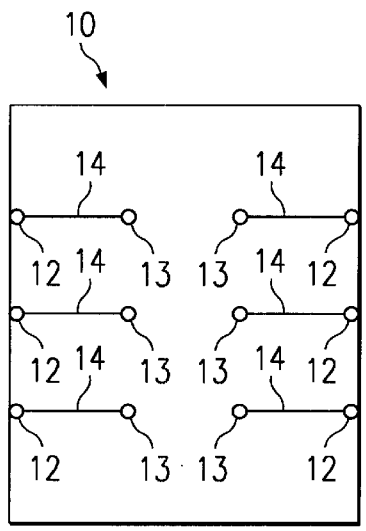
FIG. 1 is a top view of a test carrier for a semiconductor die.

FIG. 1 illustrates a top view of a prior art test carrier 10. The test carrier 10 comprises contact points 12, connecting pads 13, and metallic traces 14 connecting the contact points 12 and the connecting pads 13. The test carrier 10 is designed to be connected with external test equipment (not shown) utilizing at least one of the contact points 12. The test carrier 10 is in turn electrically coupled to a semiconductor die utilizing the connecting pads 13. In this way, the test carrier 10 acts as an interface structure between a semiconductor die and the external test equipment.

Figure 2:
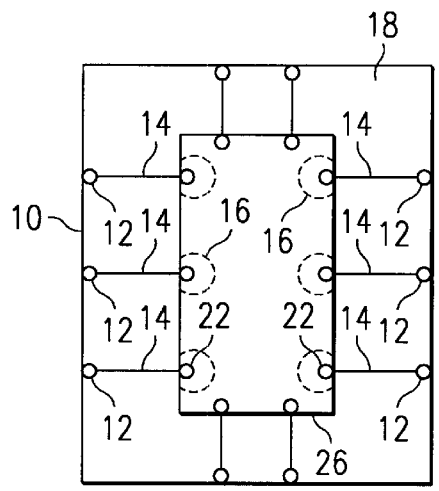
FIG. 2 is a top view of a test carrier connected to a semiconductor die.

FIG. 2 illustrates a top view of the prior art carrier 10 connected to a semiconductor die 16. The semiconductor die is "flipped" onto the test carrier 10 so that the bond pads 22 of semiconductor die 16 face the test carrier 10. One skilled in the art will recognize that test carrier 10 must be designed such that its connection pads 13 align with the bond pads 22 of the die 16 when the die is placed on test carrier 10. Signals can then be passed to and from die 16 via the path of bond pad 22, connection pad 13, metallic trace 14, contact point 12, and finally whatever test equipment is interfaced to the test carrier (not shown). Note that in order to operate as an interface for die 16, test carrier 10 must be customized such that the connection pads 13 align with bond pads 22 of the die 16. As discussed above, however, each time die 16 undergoes a revision in which one or more bond pads 22 are re-located, a new test carrier 10 must be designed and built.

Figure 3A:
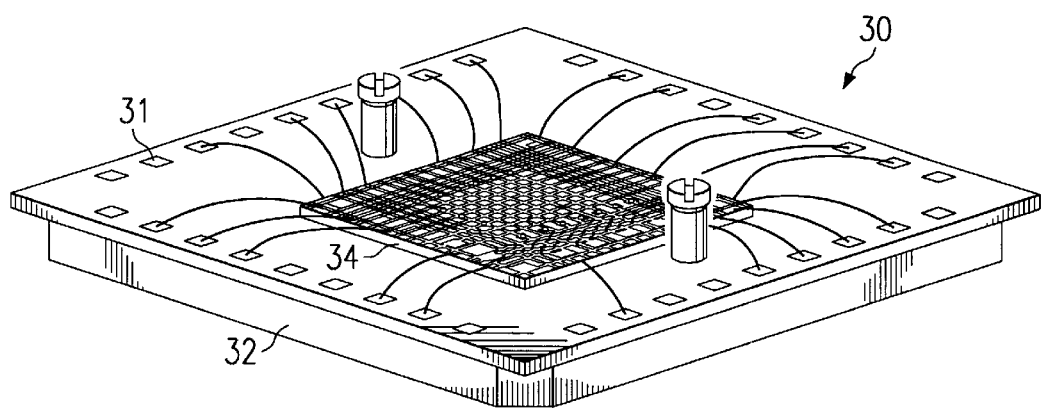
FIG. 3a illustrates a preferred embodiment test membrane in use with a test carrier.
Figure 3B:
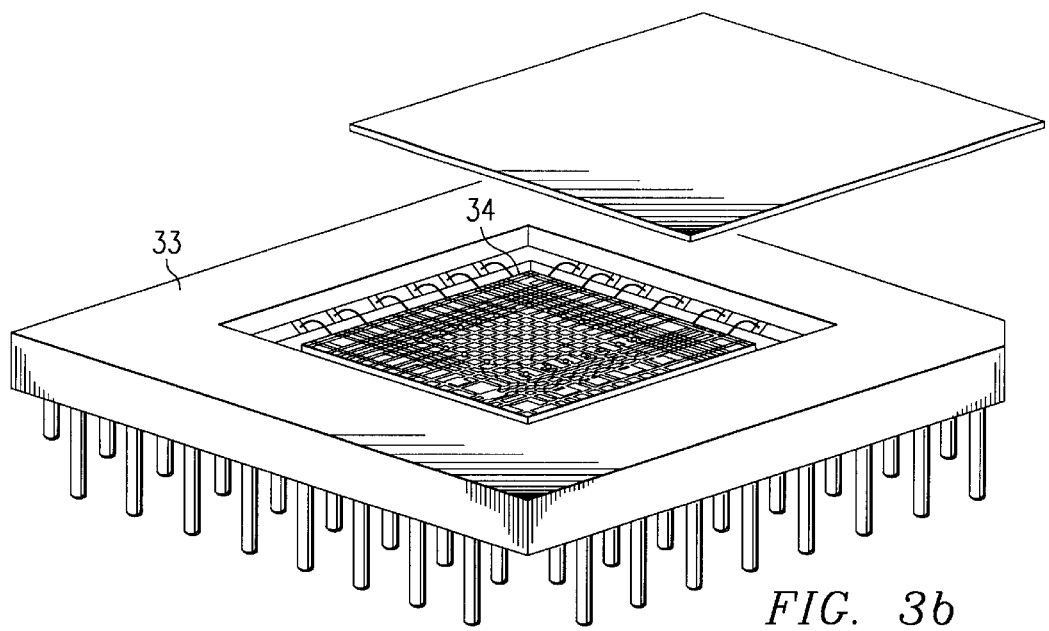

FIG. 3a illustrates a preferred embodiment test system 30 comprising a test membrane 34 and an associated test carrier 32. FIG. 3b illustrates the test membrane 34 as used with a form factor package 33, such as the illustrated pin grid array type package. The carrier 32 is designed to connect to external test equipment (not shown). The external test equipment typically includes software that defines the tests to be performed and hardware to perform the tests on the semiconductor die. The carrier may be comprised of, but is not limited to a ceramic or polymer material. The carrier 32, however, is a generic design, which is not dependant on the type of die to be tested. The carrier 32 may be designed to be used across a broad range of dies or may be generic to a specific family or group of dies or to a standard form factor. Customization to a particular die or die revision is accomplished by use of membrane 34, as will be explained in greater detail below. Thus, the carrier 32 does not require the costly redesigns as the prior art does, whenever the die to be tested undergoes a revision.

Figure 4:
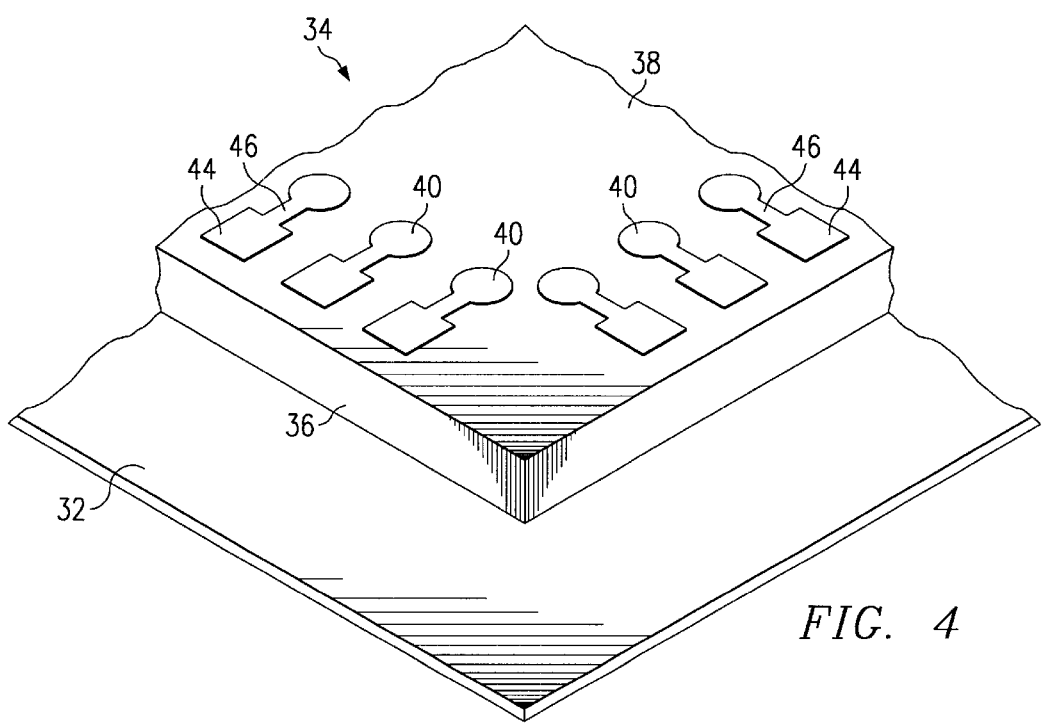
Figure 5B:
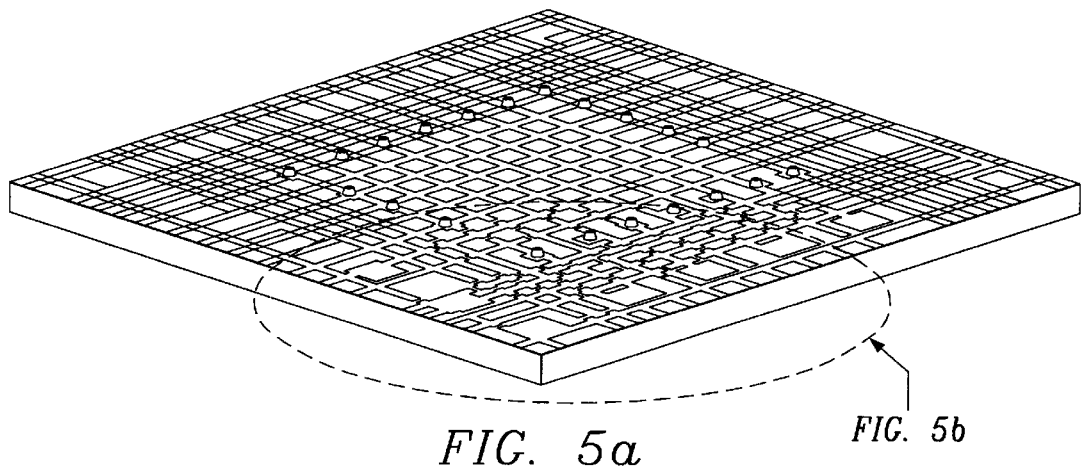
Figure 5B:
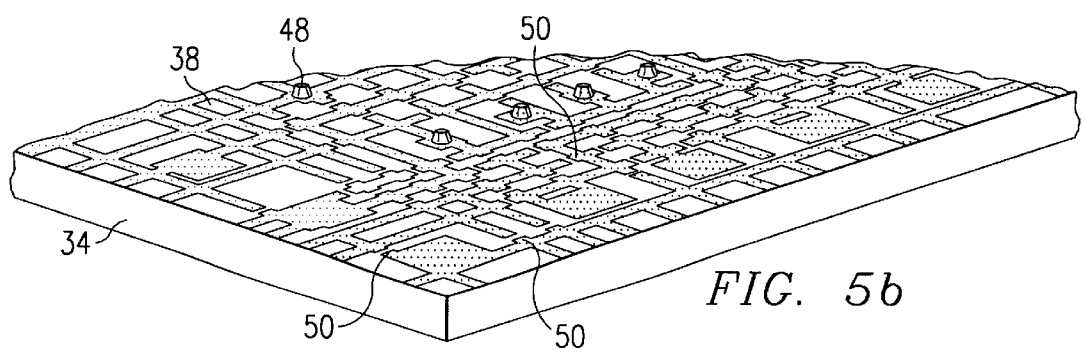

In a preferred embodiment of the present invention, the membrane 34 comprises a substrate 36 having a top surface 38 on which is located a series of contact points 44, connection pads 40, and conductive traces 46 connecting them, as shown in FIG. 4. The membrane 34 may be comprised of a ceramic or polymer material such as a liquid crystal polymer. The membrane may be any size that is suitable to properly connect the membrane 34 to the semiconductor die and suitable to fit within the constraints of the overall test system. However, the membrane is preferably sized to mirror the die size and fit within the carrier 32. The contact pads 44 are utilized to connect the membrane 34 to the carrier 32 such that signals originating at the external test equipment are transferred to the membrane 34 via pads and associated bond wire 31 on the carrier (as shown in FIG. 3a). The traces 46 connect the connection pads 44 to the contact points 40 to provide a path for electrical signals to flow between them. The connecting pads 40 are the point at which the membrane 34 is electrically connected to the semiconductor die 16. The connecting pads 40 are designed to substantially align with bond pads on the semiconductor die (not shown) when the semiconductor die is coupled to the membrane 34. This alignment will allow for the electrical signals to flow from the carrier 32 to the proper circuitry on the semiconductor die 16. A contact interface is utilized to connect the membrane 34 at the connecting pad 40 to the bond pads on the semiconductor die. The contact interface may be, but is not limited to, a stud cone, stud bump, or micro spring structure. A stud bump 48 is illustrated in FIGS. 5a and 5b.

One skilled in the art will recognize that the location of the contact points 44 can be fixed for a given test carrier, but that the location of the connecting pads 40 and hence the interconnects 46 depends upon the location of the bond pads on the semiconductor die to be tested. A membrane 34 can be quickly and inexpensively produced for a given semiconductor die layout by the use of laser etching to form the desired connecting pads 40 and interconnects 46. A preferred method for so forming a membrane 34 is described in further detail in the following paragraphs.

A conductive coating, preferably having a coefficient of temperature expansion ("CTE") close to the substrate 36 of the membrane is placed on the op surface 38. In the case of a preferred embodiment silicon substrate, the coating should have a CTE of approximately 3 ppm. The conductive coating may be, but is not limited to, tin, copper, or gold and is preferably in the range of 1–5 mils thickness. Tin is a good conductive material for ablating by the laser, however, it is has poor conductive characteristics in comparison to copper or gold. Thus, if tin is used as the conductive coating, a second coating may be applied in which a plating bath is used to re-plate the conductive areas.

The conductive coating must have a suitable environmental stress range to provide the durability needed for both burn-in and temperature testing. The environmental stress range is generally from +140° for burn-in testing to a −55° for temperature testing. A laser is then used to ablate certain regions of the conductive coating on the top surface 38. The unablated regions of the conductive coating form the connecting pads 40 and the conductive traces 46. Because the laser can be driven under (software) machine control, the matter of "re-tooling" to form a modified membrane (with its connecting pads 40 and interconnects 46 in different locations) is a simple matter of re-writing the machine control code for controlling the ablating laser. A preferred embodiment machine controlled and software driven laser system is provided by Siemens and sold under trade name Zhena CAD Driven High Speed Laser.

Preferably, a virtual map of the test membrane is formed by defining coordinates relative to some fixed reference point on the membrane. The coordinates for the contact points 44 and the connecting pads 40 can then be defined based upon the location of the contact pads 31 of the test carrier and the location of the bond pads of the semiconductor die, respectively. Once the coordinates for the contact points and the connecting pads have been mapped, well known mapping software can be employed to define the shortest path between each connection pad and its associated contact pad, in accordance with an association that is provided by the test membrane designer. Alternatively, the designer can manually define a trace between each connecting pad and its associated contact point using well known software layout tools, such as available in the Siemens Laser. After the coordinates for the connecting pads, 40 and the contact points 44, and the interconnects 46 have been defined and mapped, the map is used to drive the laser beam, using well known machine control interfaces.

In another preferred embodiment, the connecting pads 40 and conductive traces 46 are formed in two steps. In a first step, a relatively inexpensive metal such as tin or copper is used to coat the substrate and to form the pads and interconnects via the above described ablation process. After forming the pads and interconnects, the remaining metallic regions are electroplated with a thin layer of gold for improved electrical conductance characteristics.

In yet another preferred embodiment of the present invention, shown in FIGS. 5a and 5b, the top surface 38 of the membrane 34 comprises a matrix of conductive lines 50. The matrix of conductive lines 50 is designed to provide the at least traces 46 to form the connection between the connection pads and contact points. The pattern of the matrix may include lines whose location and pitch is selected so as to ensure that at least one or more of the lines with substantially align with the bond pads on the semiconductor die 16. The necessary pitch can be readily determined from the design rules for type of pads for which it is desired to form the membrane (i.e. a membrane having conductive lines 50 with a pitch of 75 microns can be readily used for various dies having layout design rules under which the bond pads may be spaced apart by 15 microns). The conductive lines of the matrix will also have a CTE close to silicon, approximately 3 ppm and may be, but is not limited to, tin, copper, or gold. The environmental stress for the conductive lines will range from +140° for burn in to a −55° for temperature test. Once the locations of the bond pads of the desired die are known, it is a simple process to determine an optimum path between the conductive line 50 corresponding to that location and the nearest contact point 44 for connection to the test equipment. Once again, using software control, a laser is used to cut one or more of the conductive lines to define the conductive traces between the contact point and the connection pad. If more than one conductive line 50 aligns with a bond pad of the die, than one of the conductive lines can be used to form the interconnect with a contact point, and the other lines can be cut and hence electrically isolated. The laser beam may have any width, provided the width is equal to or smaller than the pitch of the conductive lines, so as to ensure that only the lines which are desired to be cut are cut.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a test structure for interfacing to test equipment a semiconductor die having bond pads at predefined coordinates using a machine controlled laser, the test equipment having contact points at predefined locations, comprising:

forming a conductive material layer on a substrate;

defining first coordinates on the substrate corresponding to at least one predefined bond pad coordinate;

defining second coordinates on the substrate corresponding to at least one predefined test equipment contact point location;

defining third coordinates on the substrate corresponding to an interconnect between the predefined bond pad and the predefined test equipment contact point location;

ablating portions of the conductive material layer using a laser beam, while leaving unablated portions of the conductive material at the first, second and third coordinates.

2. The method of claim 1 further comprising plating a second conductive material onto the unablated portions of the conductive material.

3. The method of claim 1 wherein the conductive material layer comprises a continuous layer prior to the step of ablating.

4. The method of claim 1 wherein the conductive material layer comprises a matrix of conductive lines.

5. The method of claim 1 wherein said substrate is comprised of silicon.

6. The method of claim 2 wherein said conductive material layer and said second conductive material are selected from the group consisting of tin, gold, aluminum, and copper.

7. The method of claim 1 wherein the substrate is formed of a polyamide material.

8. A method for forming a test structure for interfacing test equipment to a semiconductor die, comprising the steps of:

depositing a metal layer on a substrate; and using a laser to remove portions of said metal layer to form a bond pad, a test equipment contact, and an interconnect between said bond pad and said test equipment contact, wherein said bond pad aligns with a corresponding pad location on said semiconductor die.

9. The method of claim 8, wherein said step of depositing a metal layer comprises depositing a metal layer having a coefficient of thermal expansion similar to that of said substrate.

10. The method of claim 8, further comprising the step of plating said metal layer with a second metal layer.

11. The method of claim 8, wherein said metal layer is continuous prior to said step of using said laser to remove portions of said metal layer.

12. The method of claim 8, wherein said metal layer is in the form of a matrix prior to said step of using said laser to remove portions of said metal layer.

13. The method of claim 8, wherein said step of depositing a metal layer on a substrate comprises depositing a metal layer on a silicon substrate.

14. The method of claim 8, wherein said step of depositing a metal layer on a substrate comprises depositing a layer of tin on said substrate.

15. A method for forming a test structure for interfacing test equipment to a semiconductor die, comprising the steps of:

forming a plurality of test equipment contacts on a substrate;

forming a matrix of conductive lines on said substrate, said matrix coupled to said plurality of test equipment contacts;

identifying locations in said matrix aligned with bond pad locations on said semiconductor die; and removing portions of said matrix to create a conductive path between said identified location and one or more selected test equipment contacts, wherein said conductive path is electrically isolated from said plurality of test equipment contacts other than said selected one or more.

16. The method of claim 15, wherein said step of forming a matrix of conductive lines comprises depositing a metal layer having a coefficient of thermal expansion similar to that of said substrate.

17. The method of claim 15, further comprising the step of plating said matrix of conductive lines.

18. The method of claim 17, wherein said step of plating comprises plating with gold.

19. The method of claim 15, wherein said substrate is silicon.

20. The method of claim 15, wherein said conductive lines comprise tin.

* * * * *